United States Patent [19]

Suzuki et al.

[11] Patent Number: 5,378,904
[45] Date of Patent: Jan. 3, 1995

[54] SEMICONDUCTOR INTEGRATED CIRCUIT AND METHOD AND SYSTEM FOR DESIGNING LAYOUT OF THE SAME

[75] Inventors: Goro Suzuki; Masahiro Iwamura; Tetsuya Yamamoto, all of Hitachi; Yoshio Okamura, Akishima, all of Japan

[73] Assignee: Hitachi, Ltd., Tokyo, Japan

[21] Appl. No.: 760,888

[22] Filed: Sep. 17, 1991

[30] Foreign Application Priority Data

Sep. 17, 1990 [JP] Japan .................. 2-243998

[51] Int. Cl.⁶ ............................. H01L 27/02
[52] U.S. Cl. ........................ 257/208; 257/211; 437/51; 364/488; 326/39; 326/41; 326/101
[58] Field of Search ............ 357/40; 437/51; 364/491, 490, 489, 488; 257/208, 211; 307/465, 465.1, 482.1

[56] References Cited

U.S. PATENT DOCUMENTS 4,742,471  5/1988  Yoffa et al. .................. 364/491
5,047,949  9/1991  Yamaguchi .................. 364/491

OTHER PUBLICATIONS

Handbook of Integrated Circuit Applications, published Jun. 30, 1981 by Asakura Bookstore, edited by Takuo Sugano, pp. 42–43.

Primary Examiner—Robert J. Pascal
Assistant Examiner—Reginald A. Ratliff
Attorney, Agent, or Firm—Antonelli, Terry, Stout & Kraus

[57] ABSTRACT

An LSI layout design method is for placing on a chip a plurality of different master cells, each of which has a plurality of signal wiring conductors not connected to internal elements, for example, transistors, resistors and so on for realizing a certain logic function.

20 Claims, 16 Drawing Sheets

F I G. IA
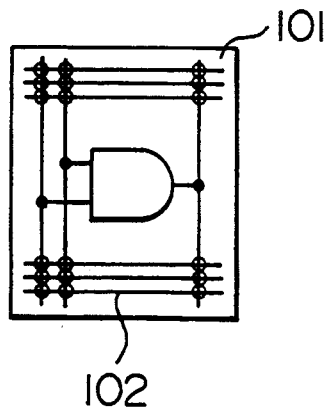
F I G. IB
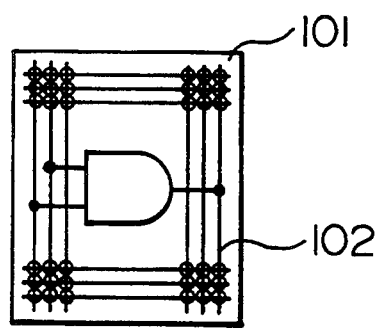
F I G. IC
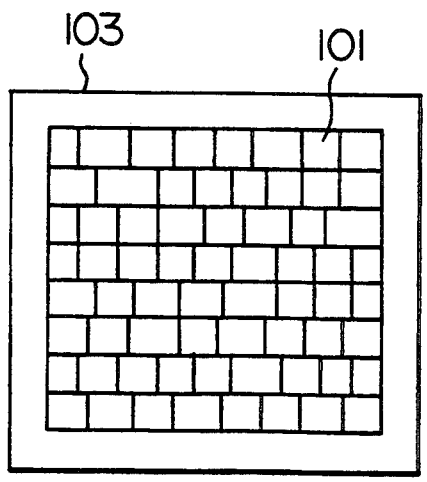
F I G. ID
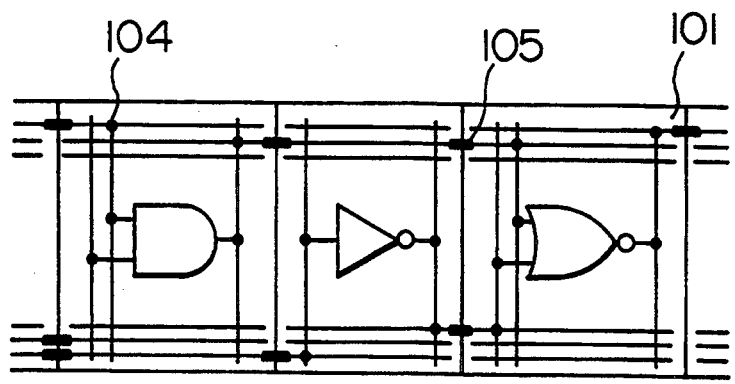

INVS
308

| 502 | 504 | 503 | 503 |
|---|---|---|---|
| β1 | INV | S5 | S6 |
| β2 | INV | S4 | S5 |
| β3 | INV | S2 | S4 |
| ⋮ | ⋮ | ⋮ | ⋮ |
| ELEMENT ID NAME | ELEMENT KIND | INPUT SIGNAL NAME | OUTPUT SIGNAL NAME |

| 602 | 502 | 504 | 503 | 503 |
|---|---|---|---|---|
| Z1 | β1 | INV | S5 | S6 |
| Z2 | β2 | INV | S4 | S5 |
| Z3 | β3 | INV | S2 | S4 |
| ⋮ | ⋮ | ⋮ | ⋮ | ⋮ |
| MASTER CELL ASSIGN RECTANGLE ID NAME | ELEMENT ID NAME | ELEMENT KIND | INPUT SIGNAL NAME | OUTPUT SIGNAL NAME |

| 602 |  |  | 308 |
|---|---|---|---|
| Z 1 | $(x_1, y_1)$ | $(X_1, Y_1)$ | INVS |
| Z 2 | $(x_2, y_2)$ | $(X_2, Y_2)$ | INVS |
| Z 3 | $(x_3, y_3)$ | $(X_3, Y_3)$ | INVS |
| MASTER CELL RECTANGLE ID NAME | RECTANGLE LEFT MOST BOTTOM VERTEX COORDINATES | RECTANGLE RIGHT MOST TOP VERTEX COORDINATES | MASTER CELL NAME |

| 1 | 3, 8 |
| --- | --- |
| 2 | 1, 2, 4, 5, 6, 7, 9 |

903    902

FIG. 16A
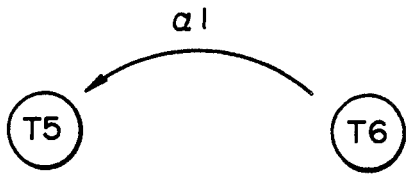
FIG. 16B
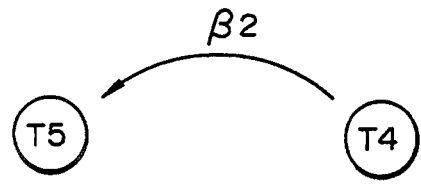
FIG. 17A
| SIGNAL NAME | EQUIV-ALENT SIGNAL NAME | GROUP NUMBER | BRANCH NUMBER | NEIGH-BORING SIGNAL NAME | EQUIV-ALENT SIGNAL NAME | ELE-MENT KIND | SINK / SOURCE |
|---|---|---|---|---|---|---|---|
| T5 | S5 | G1 | 1 | T6 | S4 | INV | S1 |
| T6 | S4 | G2 | 1 | T5 | S5 | INV | S0 |
FIG. 17B
| SIGNAL NAME | EQUIV-ALENT SIGNAL NAME | GROUP NUMBER | BRANCH NUMBER | NEIGH-BORING SIGNAL NAME | EQUIV-ALENT SIGNAL NAME | ELE-MENT KIND | SINK / SOURCE |
|---|---|---|---|---|---|---|---|
| S4 | T6 | G2 | 1 | S5 | T5 | INV | S0 |
| S5 | T5 | G1 | 1 | S4 | T6 | INV | S1 |

SEMICONDUCTOR INTEGRATED CIRCUIT AND METHOD AND SYSTEM FOR DESIGNING LAYOUT OF THE SAME

BACKGROUND OF THE INVENTION

This invention relates to a semiconductor integrated circuit and a method and system for designing a layout of the same.

In conventional layout design methods of a semiconductor integrated circuit (for example, an LSI), the existing design properties are utilized to reduce the number of the design processes for the LSI. As, for example, described in "Handbook of Integrated Circuit Applications", published Jun. 30, 1981 by Asakura Bookstore, edited by Takuo Sugano, pp. 42 to 43, there has been employed as an example of the conventional methods the layout design method generally called the building block method which is presently shown in FIG. 21. According to this method, various different master cells 107 which are previously designed, i.e. designed in advance, and stored in a library are taken out, arranged on a chip 103 and interconnected by wiring lines in a wiring region 108, as shown in FIG. 21, so as to realize the function of the semiconductor integrated circuit. (Here, the term "master cell" means a layout of patterns of a circuit which is previously designed, each of such circuits, such as a gate and a flip-flop, is considered as a unit circuit which is repeatedly used in the integrated circuit.)

However, in the conventional master cell 107, its inner layout is standardized, and its signal input/output positions are fixed along one side of the master cell, so that there is no freedom in selection of the signal input/output positions. Therefore, the master cells need to be so arranged that their signal input/output positions face the wiring region 108. Also, in order for the master cells to be interconnected in accordance with a desired logic circuit (or operation), it is necessary to that the wiring region 108 be large enough for wiring the master cells. Thus, it is impossible according to such layout scheme to design a recently developed VLSI in which a large number of gates are incorporated therein at a high density.

SUMMARY OF THE INVENTION

Accordingly, it is an object of the present invention to provide an integrated circuit and a layout design method and system for the integrated circuit in which the integration density is high and in which the number of design processes can be greatly reduced.

In order to achieve the above object, according to the layout design method of the present invention, a plurality of different master cells are provided in advance and are arranged on a chip for an LSI. Each master cell has a plurality of signal wiring line patterns which are not connected to the element(s) provided within the master cell. Here, the elements are transistors, resistors and so on for realizing a certain logic function (for example, an inverting function) within the master cell.

Moreover, according to the layout design system of this invention, there is provided means for densely arranging the master cells without leaving gaps, i.e. spacings, between them.

If each of the master cells is designed in advance to have a plurality of signal wiring lines, the number of which is equal in each master cell, and which are not connected to the elements within the master cell, when desired master cells are arranged, desired signal wiring lines can be connected to the elements of each of the arranged master cells, thereby enabling the signal input/output positions to be freely set. Therefore, when the desired master cells are arranged in accordance with a desired logic circuit arrangement, the desired master cells can be arranged substantially without horizontal and vertical gaps between them. In other words, since the plurality of signal wiring lines for setting the signal input/output positions with flexibility in accordance with the signal input/output positions of the neighboring master cells are provided within each of the master cells, no wiring line is required out of the desired master cell after the desired master cells are arranged.

Also, the number of signal wiring lines provided within each master cell is set in advance, i.e. is predetermined, to a minimum, in accordance with the whole logic circuit arrangement, and the scale of the master cell and the individual master cell are designed in advance to have the elements as well as the signal wiring lines provided at a high density substantially without requiring separate, unused areas. Therefore, in the LSI having the master cells densely arranged according to the present invention, the integration density of the LSI is greatly increased compared to an LSI according to the conventional building block method which requires the separate wiring region.

Moreover, according to the present invention, only by designing of a small number of different general-purpose master cells, a great number of integrated circuits can be arranged, so that the design time can be reduced. On the other hand, in the conventional method, in order for a large scale dedicated integrated circuit to be designed, by using master cells with fixed input/output positions, to have the same integration density as in this invention, a great number of different master cells with their different signal input/output positions are necessary so that the number of design processes becomes great.

In addition, according to this invention, the master cells are regularly and densely arranged and signals associated with a desired logic circuit arrangement (or operation) are assigned to the signal wiring lines within the master cell to determine the signal input/output positions of the master cell for the arrangement of the master cells. Therefore, the automatic layout design using a computer can be easily performed as will be described later, thus contributing to further reduction of the design time.

BRIEF DESCRIPTION OF THE DRAWINGS

These and other objects, features and advantages of the present invention will be understood more clearly from the following detailed description with reference to the accompanying drawings, wherein FIGS. 1A to 1D are diagrams for explaining a design method according to an embodiment of the present invention;

FIGS. 16A and 16B are graphic representations of a logic diagram,

FIGS. 17A and 17B are diagrams showing examples of the table indicative of the graph.

DESCRIPTION OF THE PREFERRED EMBODIMENTS

Figure 2A:
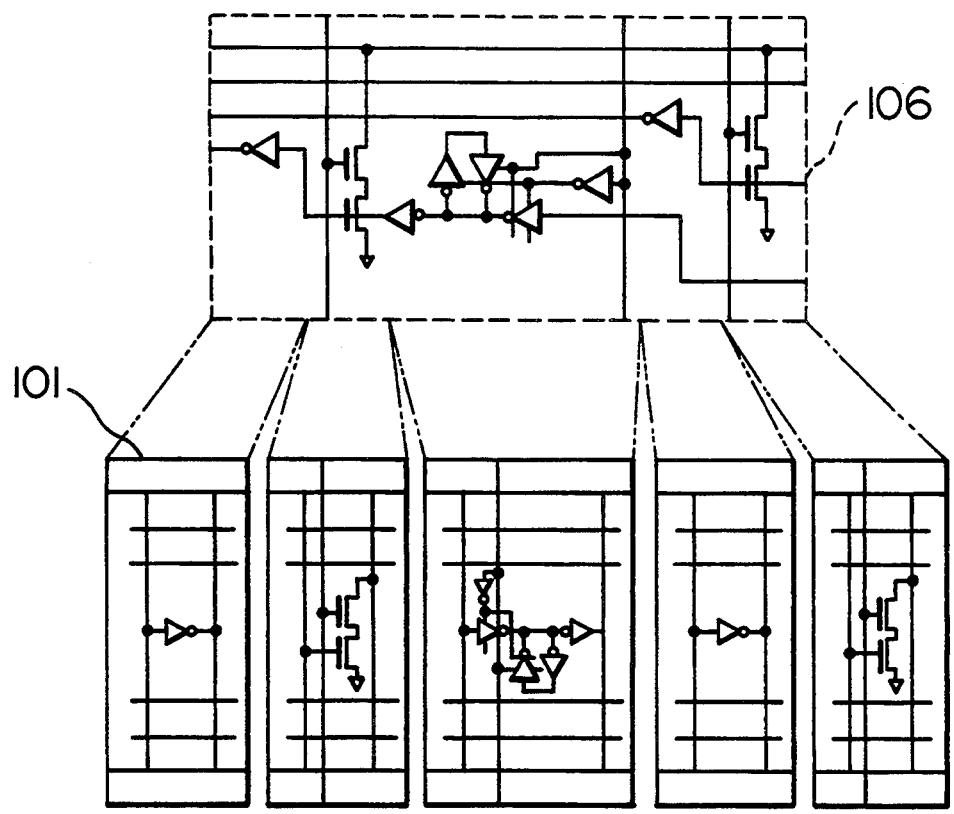
FIGS. 2A and 2B are diagrams for explaining one embodiment of DA (design automation) to which the present invention is applied.

One embodiment of the invention will be described with reference to FIGS. 1A to 1D. FIG. 1A shows an example of one of different master cells 101 previously designed, i.e. designed in advance, which are represented by logical symbols for convenience of explanation. In the master cell 101 there are six bus patterns, that is six signal wiring lines 102, that are not connected to the element in addition to an element for realizing a logic function of the master cell. Each master cell 101 is designed for a different function such as inverter, AND, NAND, NOR, EOR, or flip-flop. The master cells have the same longitudinal size, and the number and longitudinal positions of the wiring lines which are not connected to the element in each master all are designed to be common to those in another master cell. Layouts of these master cells are stored in, for example, a library, and each layout is taken out from the library according to a desired logic circuit arrangement being realized to be arranged on the pattern of a chip 103, as shown in FIG. 1C. Thereafter, as shown in FIG. 1D, contact patterns 104 and connecting patterns 105 are added to patterns of the wiring lines of the master cells 101 to complete a layout of the master cells for realizing the desired logic.

In this embodiment, the six wiring lines for setting the positions for input/output signals are provided in each master cell 101. Although the number of wiring lines may be arbitrary, an optimum number may be determined in accordance with to the desired logic circuit arrangement or the scale of the master cell. In addition, in this embodiment, only the transverse wiring lines are provided. However, longitudinal wiring lines instead of the transverse wiring lines or both the longitudinal and transverse wiring lines may be provided, as shown in FIG. 1B.

The master cell 101 is designed to be provided with patterns of an element and wiring lines at a high density for avoiding an unused area. For example, the bus pattern of a wiring line 102 may be formed to overlap on the element for the desired logic function. Therefore, the integration density of the master cell in this embodiment can be greatly increased, compared with that of a master cell when the region of the wiring lines are provided outside of the region of the master cell.

Figure 22:
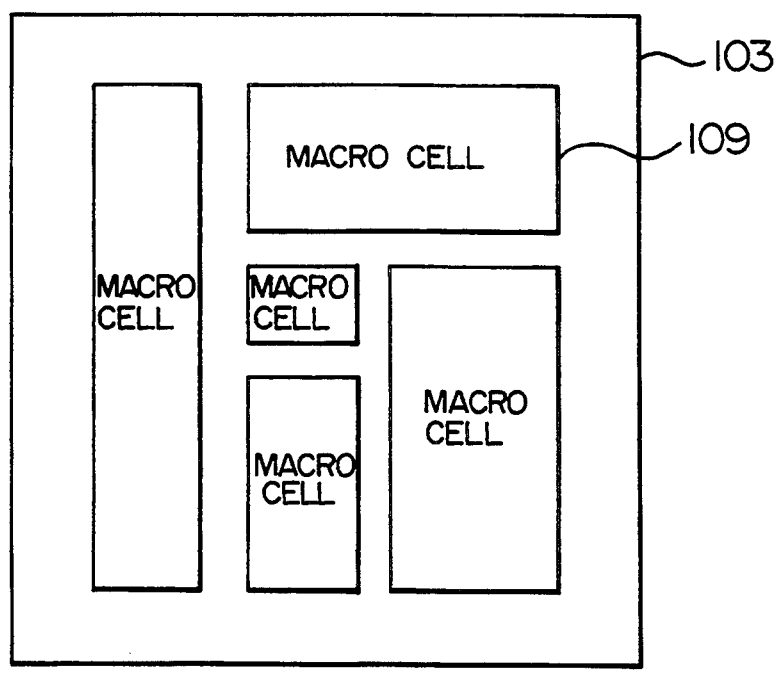
FIG. 22 is a diagram of the macro cell system.

As an LSI layout method for effectively using a chip area and reducing a design time, there is well known the macro cell technique in which a large-scale cell (hereinafter, to be referred to as macro cell) 109 which is designed in advance and stored in a library, is arranged on the area of a chip 103, as shown in FIG. 22. However, in a large-scale integrated circuit necessary for high speed processing, such as a microprocessor, since it is necessary to design, for example, about 50,000 transistors at a high density as a single macro cell, it takes an extremely long time to design such a macro cell.

As described above, according to the design method of the present invention, the layout design of a high integration density layout can be accomplished in a short time, and therefore the macro cell can be designed at a very high efficiency by this method. Specifically, when an integer operating unit of a high speed microprocessor is constituted as a macro cell 109 of about 100,000 transistors, by the application of this invention, the macro cell 109 can be constituted by previously designing only about 30 different types of master cells 101 each of which is constituted from a minimum of about 2 to a maximum of 30 transistors, for every type of inverter, NAND, NOR, EOR, ENOR, latch or the like. The design time of the macro cell 109 thus takes 50% or below of that of the conventional man-power design when the same integration density is assured.

An example of macro cell layout design when the present invention is applied to DA (design automation) technique will now be described.

Figure 2B:
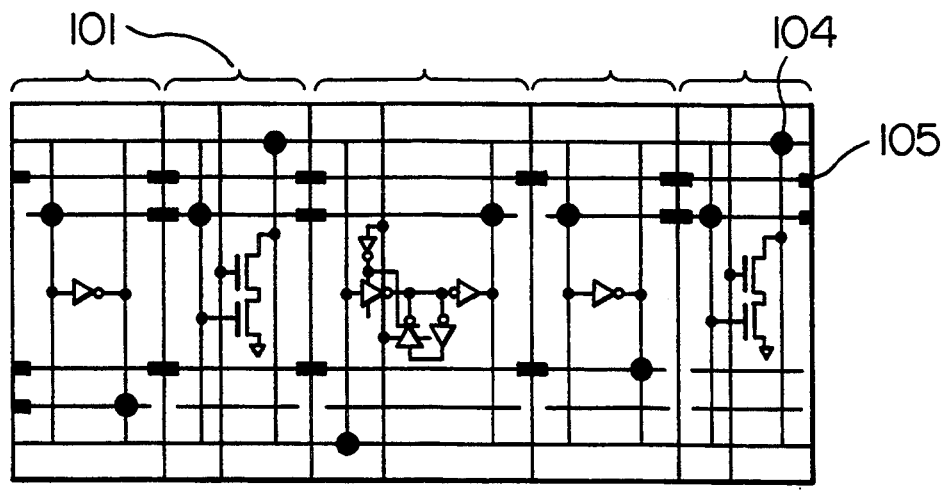

FIGS. 2A and 2B show the basic concept of the DA technique according to an embodiment of the present invention. As illustrated in FIG. 2A, layouts of various different master cells 101 are designed in advance and registered in a computer. A designer operates the computer on an interactive basis while viewing the display of the computer. When the designer instructs it to arrange a master cell on a portion of a logic diagram 106 of a macro cell displayed on the display, as shown in FIG. 2B, the computer automatically arranges a layout of the master cell, and adds contact patterns 104 and connecting patterns 105 to the master cell layout to realize the logic circuitry of the macro cell. This layout of the macro cell is displayed on the output unit such as the display.

The DA technique and the design system used for the DA technique will be described in detail. Here, description is made taking as an example the design of a bit slice type of macro cell in which a logic is repeated for each bit, as in a central processing unit (CPU) of a microprocessor. Particularly, the CPU is of 32-bit type.

Figure 3:
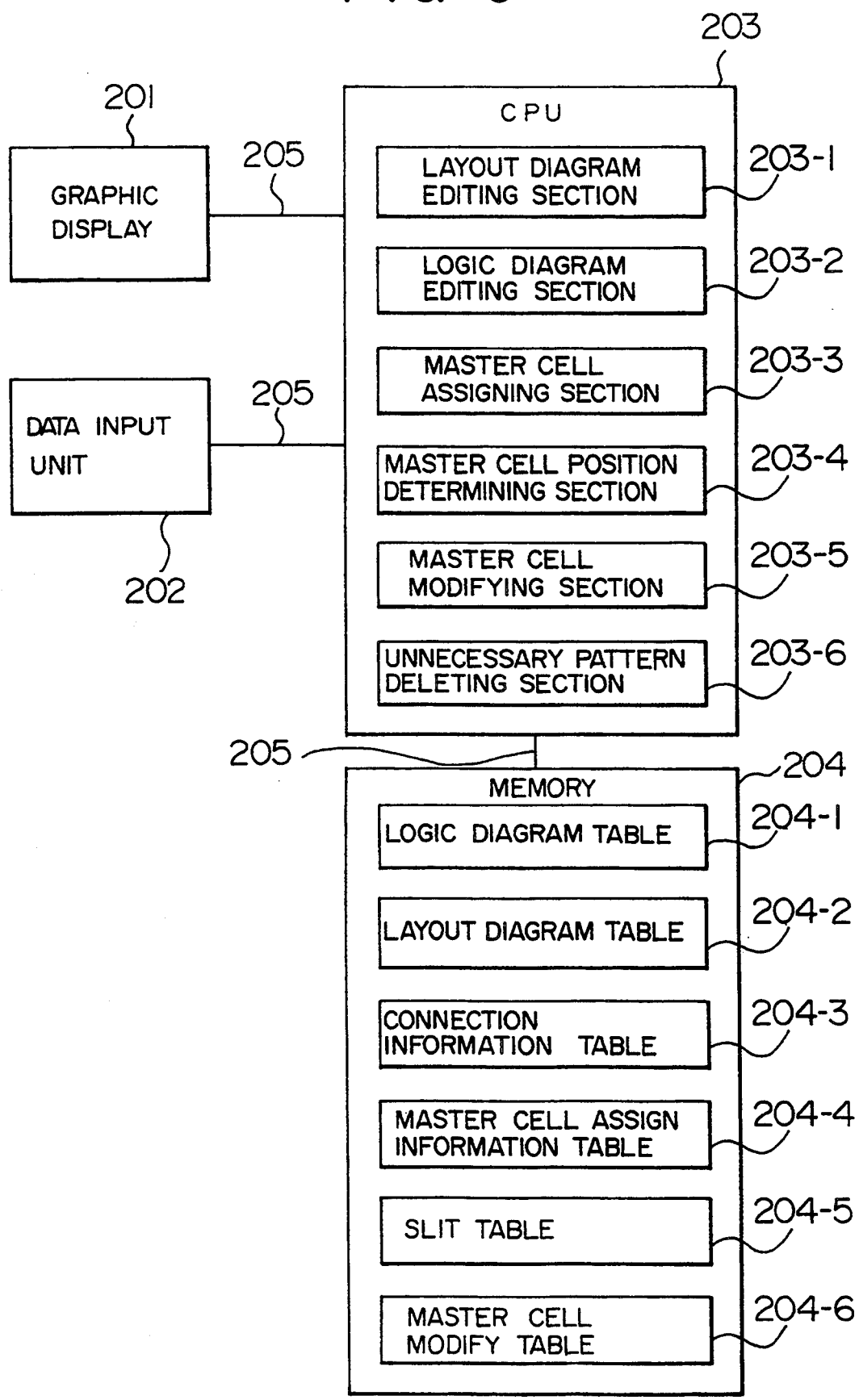
FIG. 3 is a block diagram showing an arrangement of a layout design system according to an embodiment of the present invention.

FIG. 3 is a block diagram showing an arrangement of a layout design system according to one embodiment of the invention. This system includes a central processing unit (CPU) 203, a memory 204, a graphic display 201, a data input unit 202 and a signal bus 205 connecting these elements as illustrated. The graphic display 201 is not limited to the display, but may be an output unit capable of producing graphic information, such as a plotter or printer.

The detailed arrangement of the system will be mentioned, taking as an example a case where the present invention is applied to the layout design.

The CPU 203 includes a layout diagram editing section 203-1, a logic diagram editing section 203-2, a master cell assigning section 203-3, a master cell position determining section 203-4, a master cell modifying section 203-5, and an unnecessary pattern deleting section 203-6. The function of each of these sections is realized by a program.

The memory 204 includes a logic diagram table 204-1 for storing graphic information of logic diagrams, a layout diagram table 204-2 for storing graphic information of layout diagrams, a connection information table 204-3 for storing logical connection information of logic diagrams, a master cell assign table 204-4 for storing information of master cells assigned on a logic diagram of a macro cell, a slit table 204-5 for use in automatic arrangement of master cells, and a master cell modify table 204-6 for use in modifying master cells.

The graphic display 201 displays graphic or character information fed from the CPU 203. The data input unit 202 is used t-o input layout graphic information of master cells or graphic information for assigning master cells on the logic diagram of the macro cell, and it is formed of, for example, a pointing device such as a tablet or mouse, a key board or a combination thereof.

Figure 4:
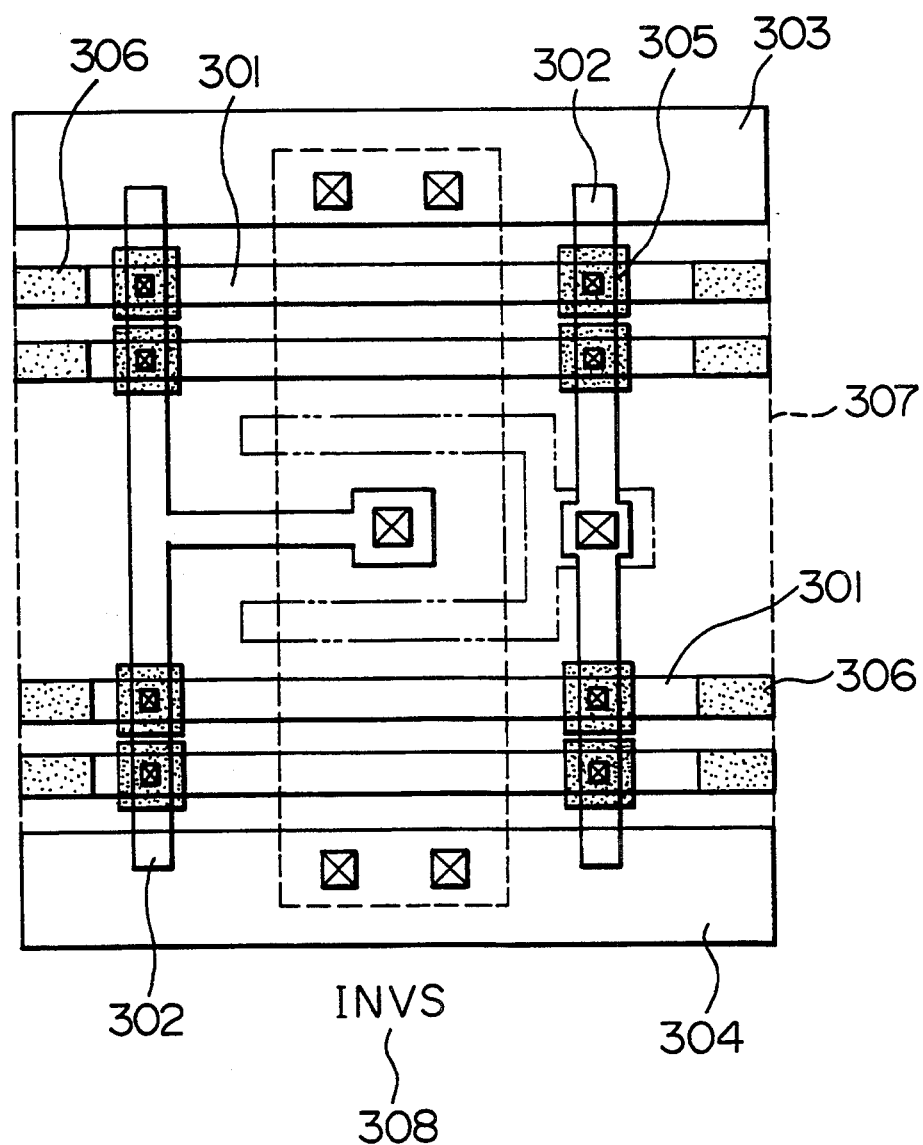
FIG. 4 is a diagram showing an example of a layout of a master cell.

First, the function of the layout diagram editing section 203-1 will be described- The function of this section 203-1 is used to make layout diagrams of a plurality of different master cells having different logic functions. The layout graphic information inputted through the unit 202 is supplied to the section 203-1 of the CPU 203. The section 203-1 processes the input layout graphic information in accordance with a preset processing program to make a logic diagram and stores the logic diagram in the layout diagram table 204-2. This table 204-2 includes the graphic vertex coordinates information and attributes of the logic diagram, such as kinds of masks (for example, polysilicon layer, diffusion layer and aluminum layer) and display color. FIG. 4 shows an example of the layout of a master cell having an inverting function (signal inverting circuit) as a layout diagram supplied to the section 203-1. This master cell has a layout for realizing the function of the inverter (including an upper power supply line pattern Vcc 303 and a lower ground line pattern GND 304) and two signal wiring line patterns 301 of an aluminum-1 layer on each of the upper and lower areas. The wiring line patterns of the input and output signals to and from the inverter circuit are two vertical aluminum-2 layer patterns 302, respectively. Contact patterns candidates 305 are used to add contact patterns to the layout when it is decided by the master cell modifying section 203-5 where input and output signals are connected. Connecting pattern candidates 306 of the aluminum-1 layers are used to add connecting patterns to the layout.

The section 203-1 also stores in the table 204-2 the information of the contact patterns and aluminum-1 layer connecting patterns inputted from the unit 202. A rectangular master cell frame 307 is used when a master cell is automatically arranged by the section 203-4. The section 203-1 also stores the information of the rectangular master cell frame inputted from the unit 202 in the table 204-2. 308 denotes the name of the master cell. In this case, this name indicates the master cell having the inverter function. The section 203-1 also stores the master cell name inputted from the unit 202 in the table 204-2.

The fundamental function of the logic diagram editing section 203-2 will be described. This function is used to make a logic diagram of the whole macro cell and a logic diagram of a master cell.

Figure 5A:
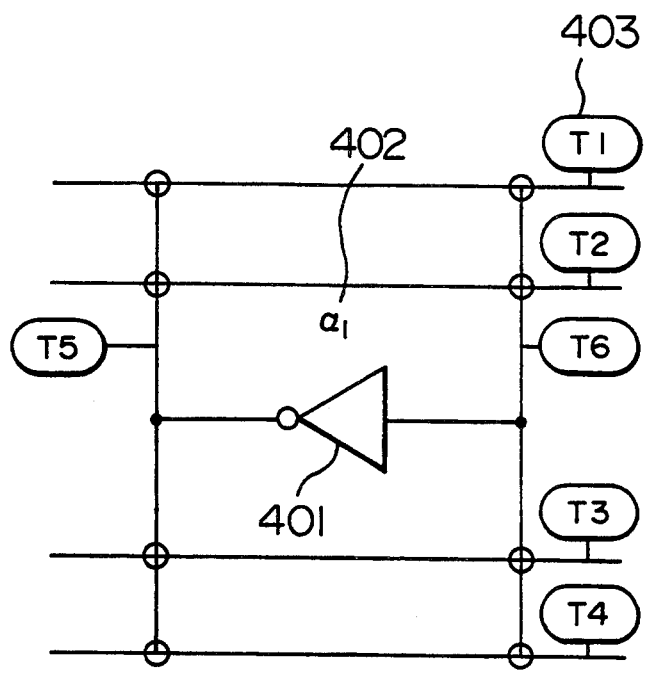
FIGS. 5A and 5B are diagrams for explaining an example of the logic diagram of a master cell.
Figure 5B:
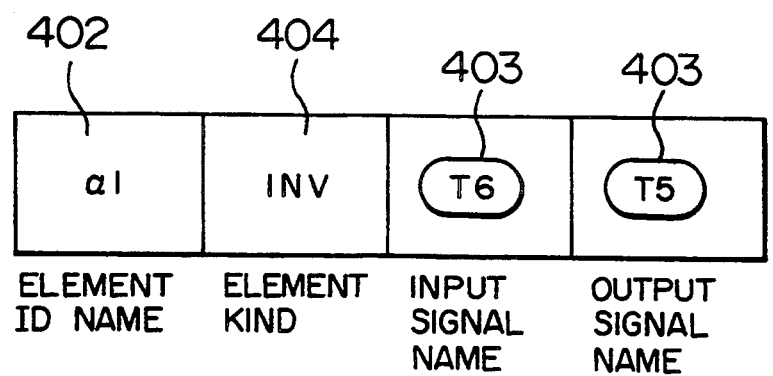

The logic diagram of the master cell is produced in one-to-one correspondence to the layout diagram of the master cell made by the section 203-1. When a symbol name of the inverter, its position information, wiring line information, and a master cell signal name assigned to each signal wiring line of the master cell which are previously registered in the computer, are inputted, a logic diagram is displayed on the graphic display 201, as shown in FIG. 5A. At the same time, in the logic diagram table 204-1 are stored a master cell element identifying (ID) name 402 and its position information of the element symbol 401, the vertex coordinates information and master cell signal names 403 of the wiring lines and the like by the section 203-2. Moreover, as shown in FIG. 5B, logic connection information, which indicates what element (designated by an element kind 404 and the master cell element identifying name 402) having what function is connected to what master cell signal name 403, is stored in the connection information table 204-3.

Figures 6A, 6B:
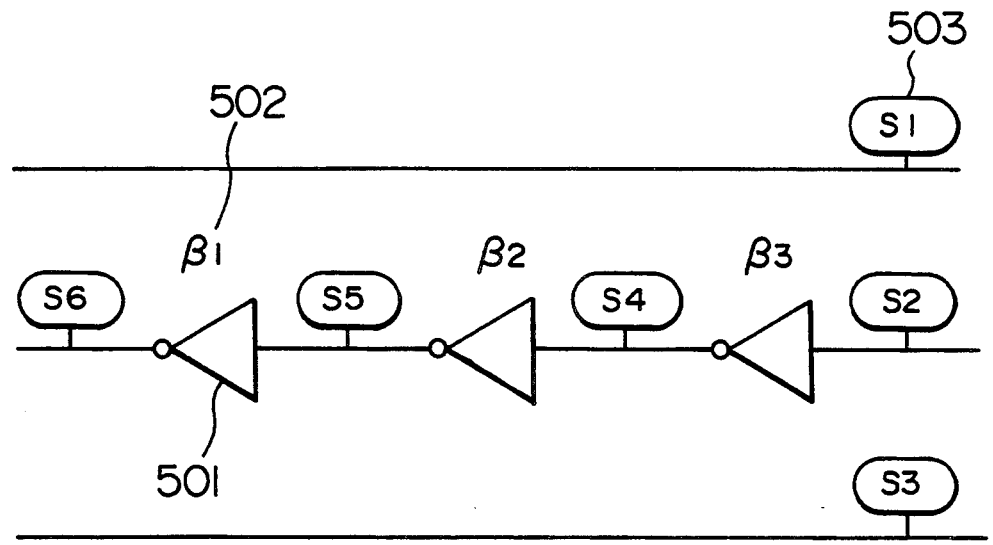
FIGS. 6A and 6B are diagrams for explaining part of the logic diagram of a macro cell.

The logic diagram of the whole macro cell is also similarly produced as the logic diagram of the master cell. When the information of the symbol name of an element, its wiring line position, wiring line and cell signal name are inputted, the logic diagram of the macro cell is displayed on the graphic display 201, as shown in FIG. 6A. At the same time, in the table 204-1 are stored a cell element identifying name 502 and position information of an element symbol 501, vertex coordinates information and cell signal names 503 of the wiring lines by the section 203-2. In addition, an element kind 504, the cell element identifying name 502 and the cell signal name 503, as shown in FIG. 6B, are stored in the table 204-3.

Figures 7A, 7B:
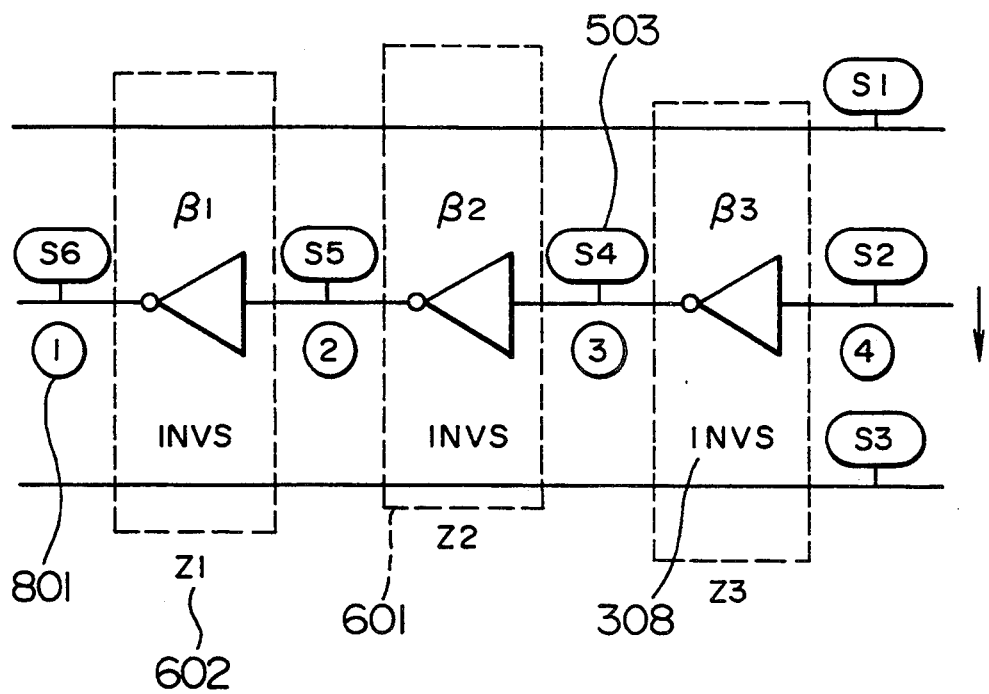
FIGS. 7A and 7B are diagrams showing assignment of master cells to the logic diagram of the macro cell.
Figures 8, 9:
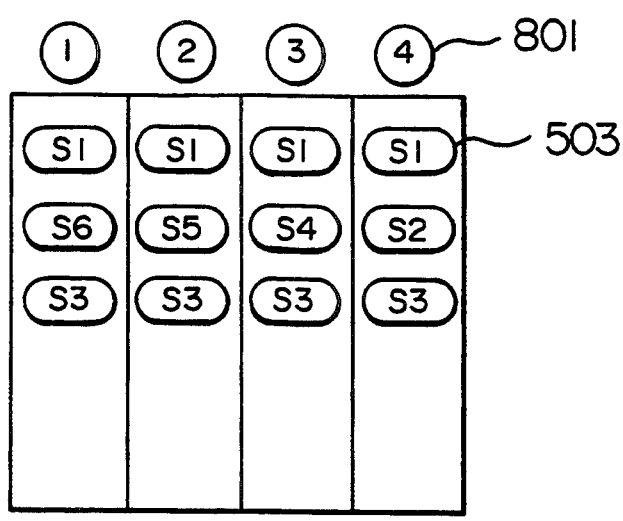
FIG. 8 is a diagram showing an example of the master cell assignment information table.
FIG. 9 is a diagram of an example of a slit signal table.

The basic function of the master cell assigning section 203-3 will be mentioned. First, inputting is made on what master cell is assigned to what portion of the logic diagram of the whole macro cell shown in FIG. 6A which is displayed on the display 201 to accomplish the layout of the macro cell. To do this, a master cell assign rectangle 601, an assign rectangle identifying name 602 and the master cell name 308 assigned to each master cell are inputted from the unit 202, as shown in FIG. 7A. The section 203-3 stores the X- and Y-coordinates of the lower left and upper right points of the inputted rectangle, the identifying name 602 and the cell name 308 in the table 204-4 shown in FIG. 8. Moreover, in order to cut out rectangles from the logic diagram of the whole macro cell, the section 203-3 stores the assign rectangle identifying name 602 added to the element identifying name 502 in the table 204-3 for the whole macro cell shown in FIG. 6B in addition to the connection information concerning the element present in each cut out rectangle in the table 204-3 (FIG. 7B). In addition, for the processing in the section 203-6, the signals 503 crossing the left and right sides of each rectangle 601 are stored in a signal table within the master cell modify table 204-6, shown in FIG. 9. Each column ① to ④ 801 of this table shows ]regions on the left and right sides of the three rectangles 601 shown in FIG. 7A.

The fundamental function of the master cell position determining section 203-4 will be described. The section 203-4 automatically determines the positions of the master cells assigned on the logic diagram of the whole macro cell, so as to arrange the master cells in a dense manner, as shown in FIG. 7A.

Figures 10A, 10B:
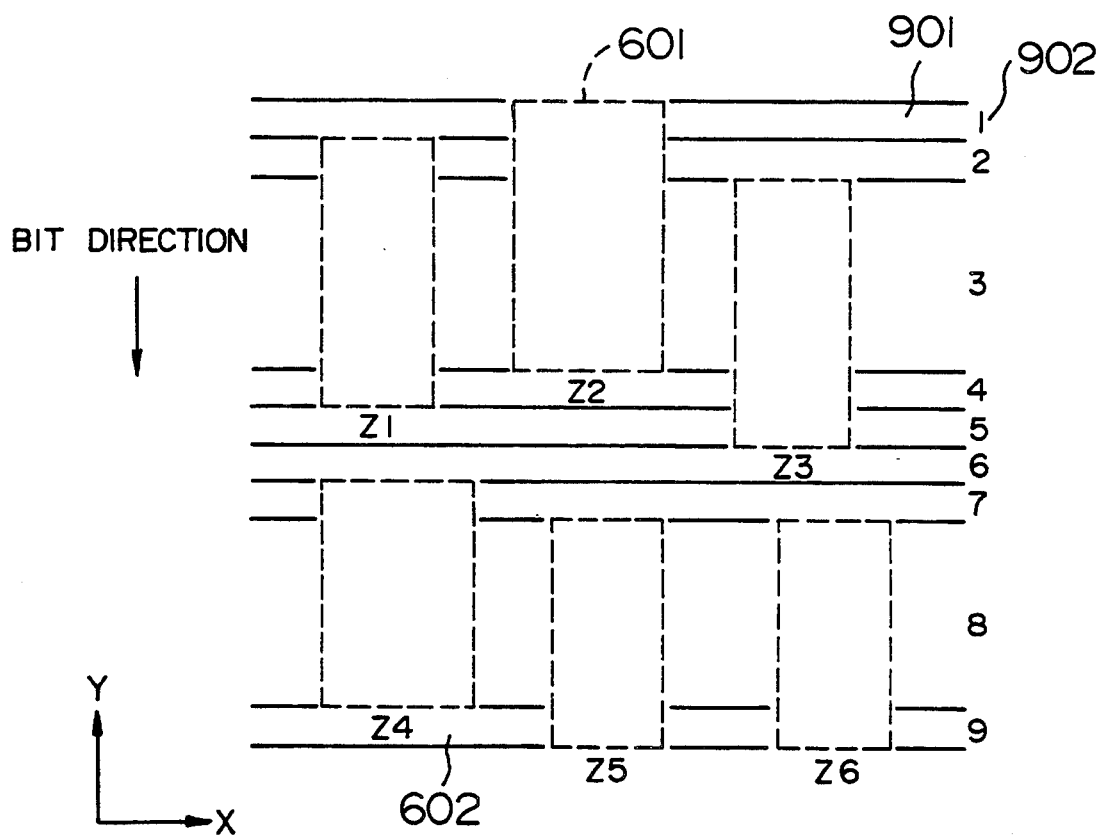
FIGS. 10A and 10B are diagrams of an example of division of the logic diagram of the macro cell to which the master cells are allocated into slits.
Figure 11:
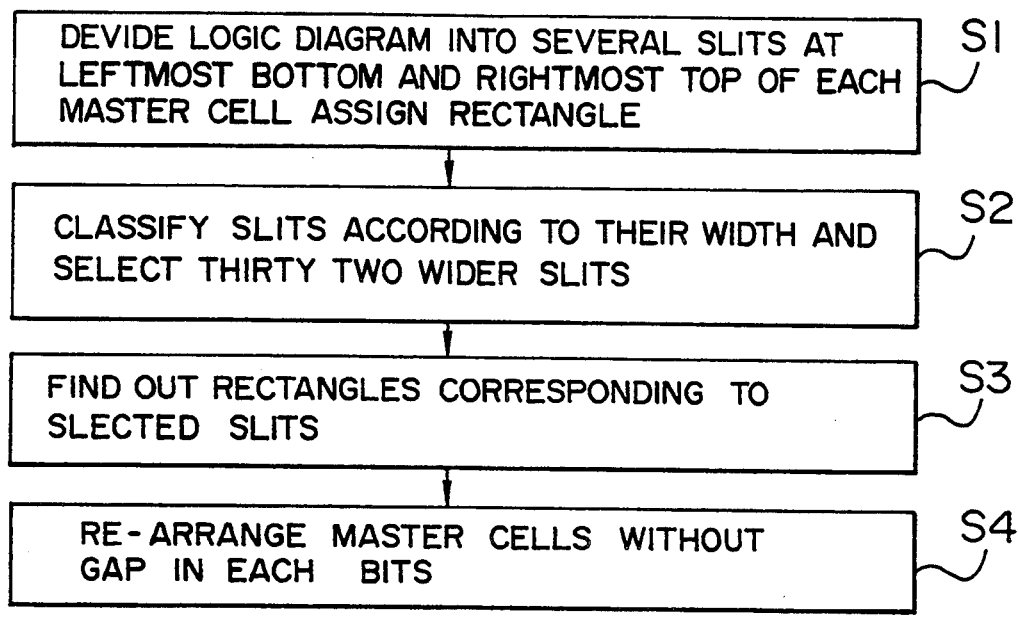
FIG. 11 is a flowchart showing a procedure for arranging master cells.

The rectangles 601 on the logic diagram of the whole macro cell shown in FIG. 7A are displaced from each other in the direction perpendicular to the bit direction because they are manually arranged at arbitrary positions on the logic diagram. Moreover, the heights of the master cells per bit on the layout should be constant, but the rectangles 601 on the logic diagram are delicately different in size because they are manually inputted. However, since the logic diagram of the whole master cell is of the bit slice type and the same logic repeatedly appears in the bit direction, the rectangles 601 are aligned substantially in the direction perpendicular to the bit direction, as shown in FIG. 10A. Thus, the section 203-4 arranges master cells according to the procedure shown in FIG. 11.

In a step S1, the logic diagram is divided into horizontal slits 901 as shown in FIG. 10A based on the X-and Y-coordinates of the lower left point and upper right point of the rectangles 601 stored in the table 204-4. The slits 901 are classified in accordance with their width, as shown in FIG. 10B. 902 denotes the slit number for use in classifying the slits, and 903 groups of slit numbers.

In a step S2, since the CPU is of 32 bits, 32 slits are taken out from the group of slit numbers having width slits.

In a step S3, the rectangles 601 for a wider slit taken out at the step S2 are found and re-arranged to have the same longitudinal bit position on the layout. At this time, the master cells are re-arranged by changing the layout information of the master cells having the same names as the master cell names 308 within the table 204-4 shown in FIG. 8.

Figure 12:
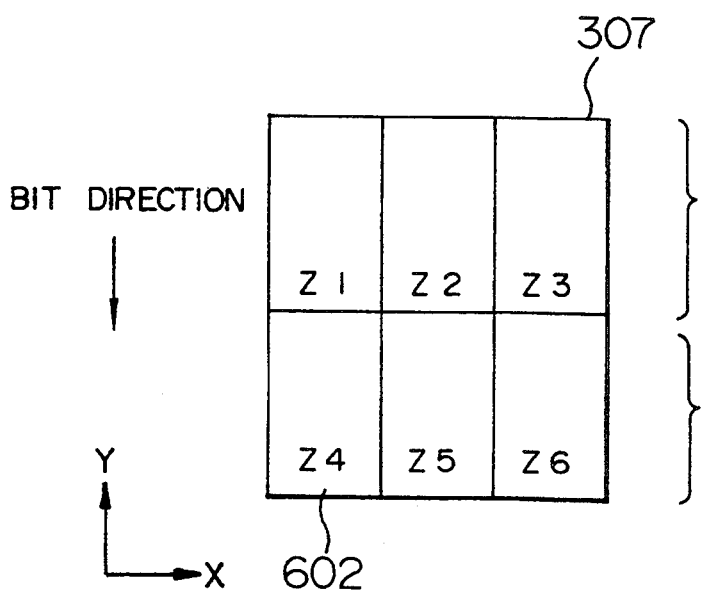
FIG. 12 shows an example of the arrangement of the master cell layout.

In a step S4, the master cells concerning a target bit are re-arranged such that gaps do not exist between the master cells from, for example, the left in order while the left and right relation on the logic diagram is kept. At this time, since all the master cell frames 307 produced by the section 203-1 are designed to be rectangular, the position of each master cell is determine, from the lower left X-coordinate point and its transverse width. FIG. 12 shows the result as part of a macro cell layout. A master cell which is longitudinally long over a plurality of bits is also similarly treated.

The fundamental function of the master cell modifying section 203-5 will be described below.

Figure 13:
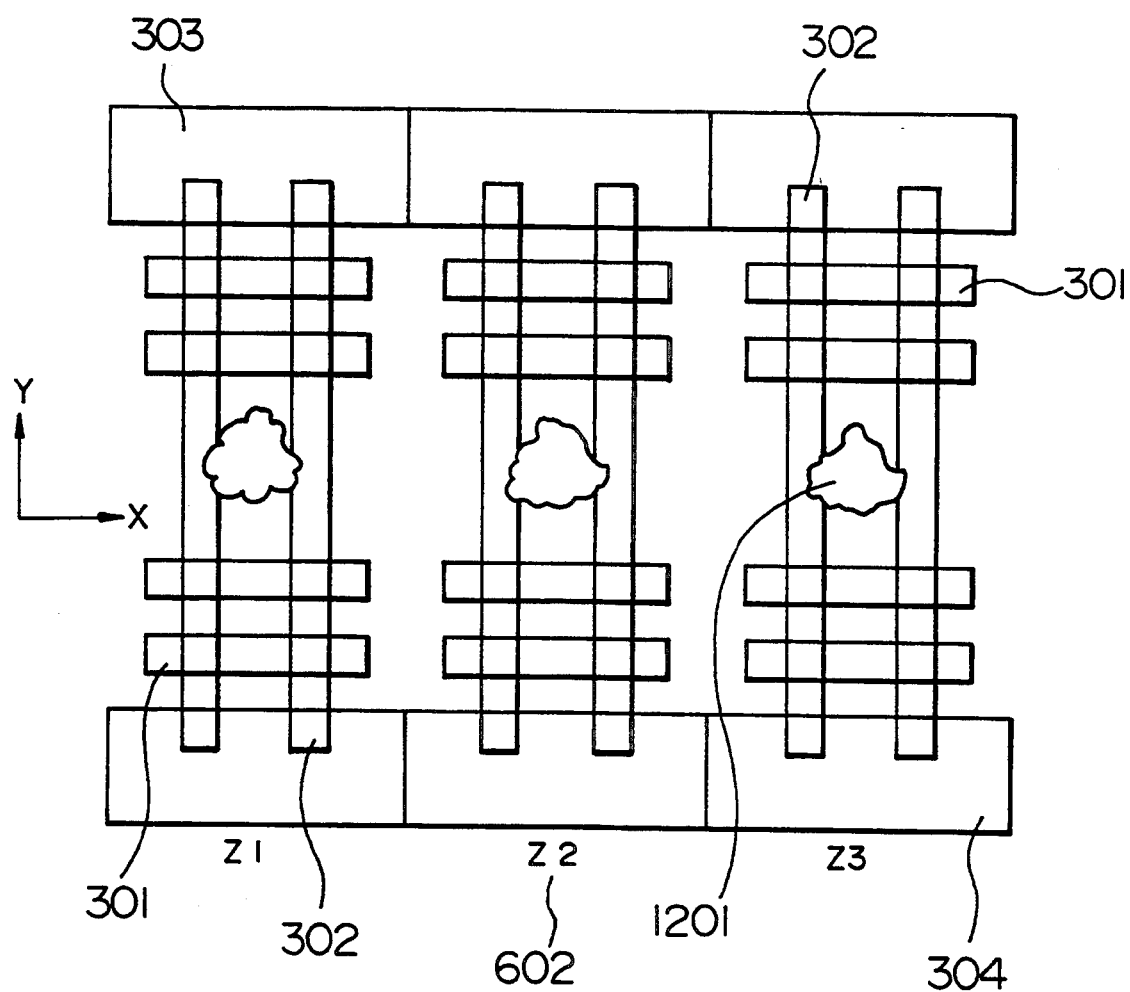
FIG. 13 is a detailed diagram showing the arrangement of the master cell layout.

FIG. 13 shows the result of the hierarchical development for the first-bit portion of the macro cell layout shown in FIG. 12. In FIG. 13, like elements corresponding to those in FIG. 4 are identified by the same reference numerals. The contact pattern candidates 305 and the aluminum-1 connecting pattern candidates 306 are omitted for purpose of simplification of the drawing. 1201 represents the ranges in which the patterns of the inverter elements are omitted for the sake of simplifying the drawing.

Figure 14:
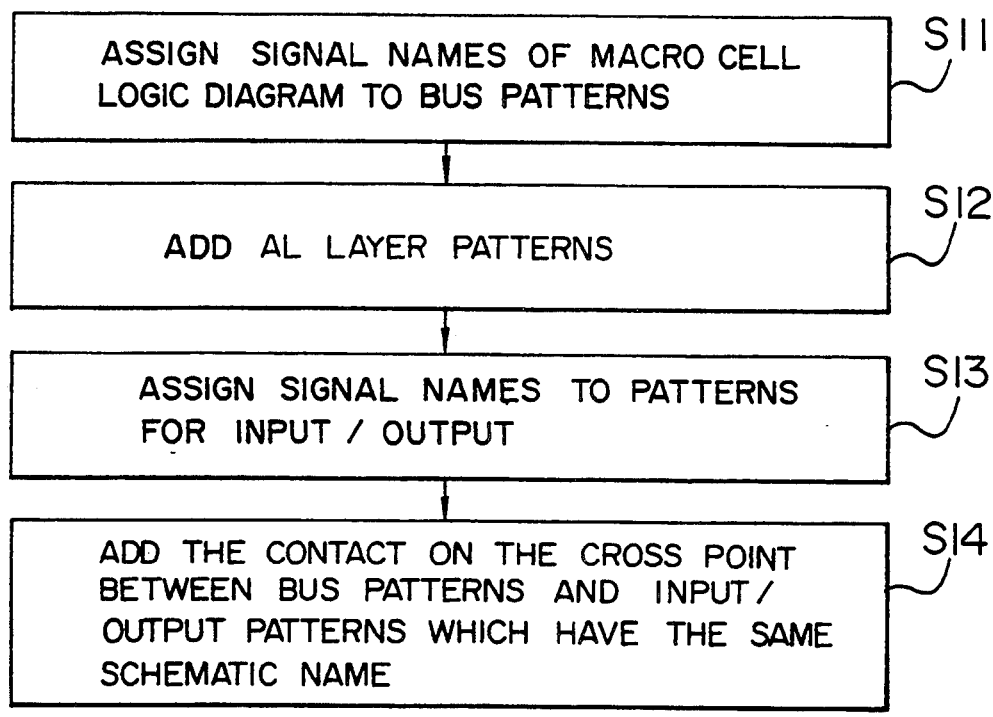
FIG. 14 is a flowchart showing a procedure for automatic modifying processing.

Since the longitudinal patterns 302 for input/output signals of transistors for realizing the inverter function are not yet connected to anywhere under this condition, the section 203-5 adds contact patterns and aluminum-1 connecting patterns in accordance with the following procedure (FIG. 14), thereby realizing a desired logic.

Figure 15:
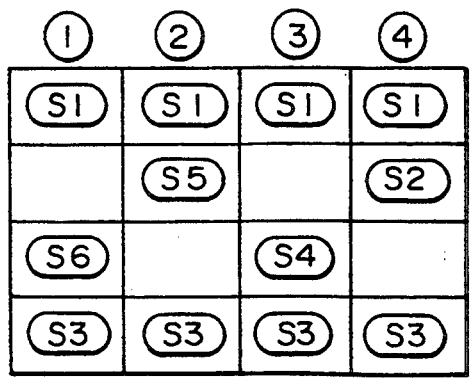
FIG. 15 is a diagram of a signal wiring line assigning table.

In a step S11, the signal names of the macro cell logic diagram are assigned to the patterns of the signal wiring lines 301. Each column of a signal wiring assign table within the table 204-6 shown in FIG. 15, as in the signal table of FIG. 9, indicates the wiring regions 801 on each of the left and right sides of the rectangles 601 on the logic diagram. Each row of this table indicates 4 signal wiring lines. The signal names written on the slit signal table are written in the blanks of this signal wiring assign table. The column for a signal name to be written is determined by the column of the signal table, and the row for the signal name to be written is determined according to the following procedure.

In a substep S111, since the outermost column signals of the signal table are the boundaries to the external of the CPU cell, the positions of the signals are determined by those of the signals on the external of the CPU cell. Thus, the signals of the outermost columns are written. However, when the same signal name appears on a plurality of columns of the signal table, they are also written even in the corresponding columns of the assign table. Since the signal wiring lines 301 are straight lines, the rows for the signal to be written are made coincident with the rows of the outermost columns. If during the above processing, different signals should be written in the same column on the assign table, the assigning operation is again performed after the change of the position because the signal position on the boundary to the external is not satisfactory.

In a substep S112, the remaining signals are assigned to the blank rows on the assign table. Here, different signals cannot be written in the left and right columns adjacent to the already written column. If the different signals were assigned to the left and right columns adjacent to the written column the different signals would be added to a single pattern. If the assignment is failed, the assignment is differently changed over other columns. If it is finally failed, the master cell modify processing cannot be made.

In a step S12, the aluminum-1 layer connecting pattern candidates 306 corresponding to the signal names written in the assign table are converted into actual patterns. That is, aluminum-1 layer connecting patterns are provided on the signal written regions.

In a step S13, the signal names on the cell logic diagram are assigned to the longitudinal layout patterns 302 for the input/output signals of each master cell.

In a substep S131, the pattern diagram of the master cell shown in FIG. 4 is in one-to-one correspondence to the master cell logic diagram of FIG. 5A. Thus, the assignment of the signal names 503 of the macro cell logic diagram shown in FIG. 7 to the longitudinal layout patterns 302 for the input/output signals of the master cell in FIG. 13 means that the signal names of the element input/output portions of the master cell signal names 403 in FIG. 5 are associated with the signal names of the element input/output portions of the macro cell signal names 503 in FIG. 7 (for example, a signal name T5 is associated with a signal name S4).

The method therefor will be mentioned below. The signal is treated as a node, and the orientation of the signal is selected as that of a branch, so that each logic diagram is shown by a directed graph. FIG. 16A corresponds to the logic diagram of FIG. 5, and FIG. 16B corresponds to the logic within a rectangle Z2 in FIG. 7. Within the computer, in the tables shown in FIGS. 17A and 17B are written the number of branches of a concerned signal, signal names of adjacent nodes, kind of element oil the branch between the adjacent nodes, information of sink (SI) or source (SO) adjacent to concerned signals, so that each graph shown in FIGS. 16a and 16B is stored.

In a substep S132, the number of branches, the kind of element on the branch between adjacent nodes and information of source or sink are used, and signals of which the three data are equal are found from the tables, and grouped. In this case, when signals on two tables are equal in these three data, the signals are decided to be in the same group. In FIGS. 17A and 17B, signals T5 and S5 are in the same group G1, and signals T6 and S4 are in the same group G2.

In a substep S133, if a signal of the same group name is present in the two tables, the correspondence therebetween is decided to be completed. For example, the signal T5 corresponds to the signal S5, and the signal T6 corresponds to the signal S4. After completion of the correspondence, the corresponding signal name is filled in the adjacent signal blank of each table. If a signal having no correspondence relation remains, the processing goes to a substep S134.

In the substep S134, the processing for the correspondence relation is made in accordance with the equivalent signal name of the neighboring signal and the number of neighboring signals completed for the correspondence processing, of a signal group having the same group name on two tables. If the correspondence processing is finished, the equivalent signal name is filled in the neighboring signal blank of each table.

In a substep S135, the processing of the substep S134 is repeated. When no new signal to be processed for the correspondence relation occurs, the processing advances to a step S14.

In the step S14, the contact pattern candidates 305 at the points where the signal wiring line patterns 301 which are assigned with the same macro cell logic name, and the longitudinal pattern 302 of the input/output signal to or from the element cross are converted into actual patterns (added with contact layer patterns).

Figure 18:
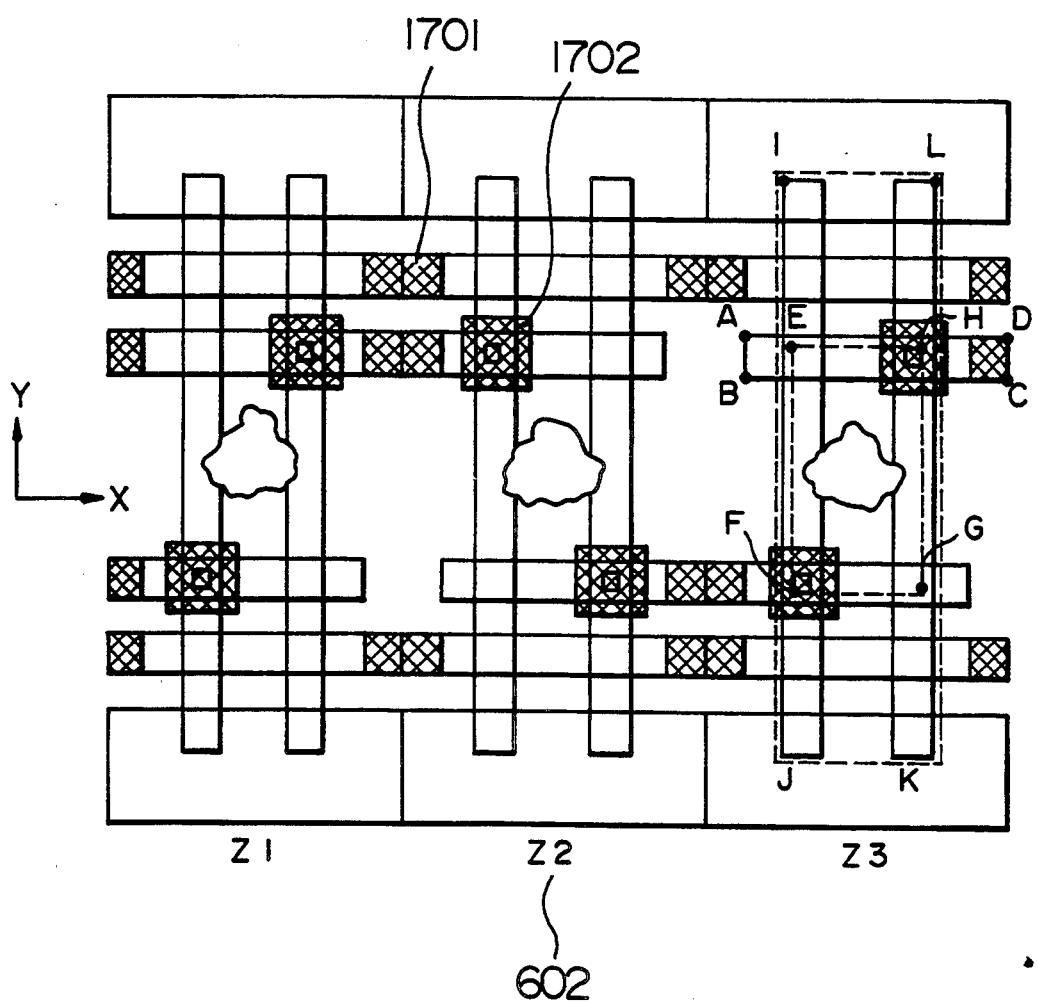
FIG. 18 is a diagram of an example of the modified arrangement of the master cell layouts.

FIG. 18 shows the result of modifying in the above processing. 1701 indicates an added aluminum layer actual pattern, and 1702 an added contact layer pattern.

In the above embodiment, the master cells are arranged in the transverse direction. However, the same processing may be applied when the master cells are arranged in the longitudinal direction.

Figure 19:
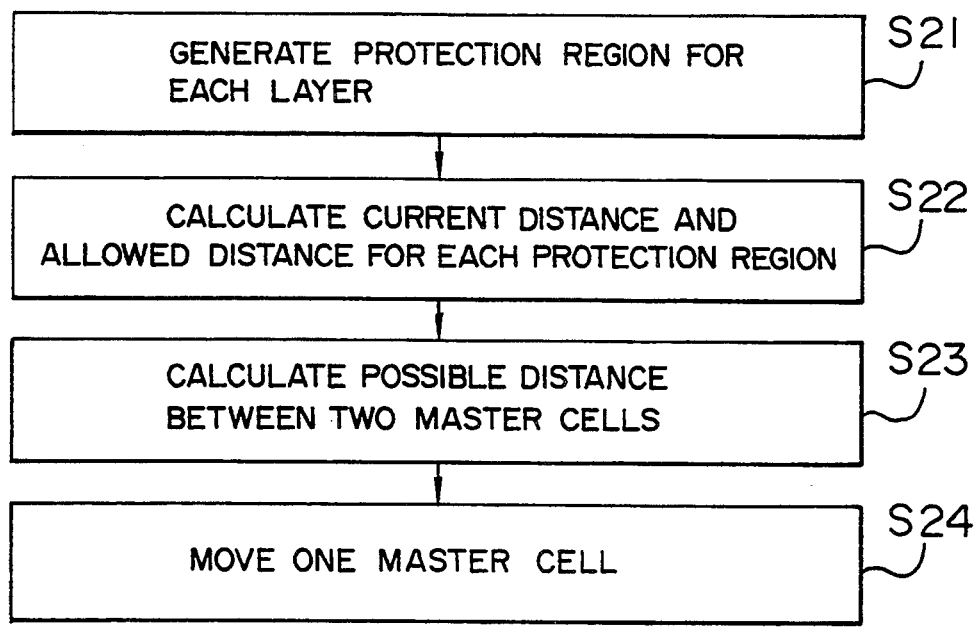
FIG. 19 is a flowchart showing a procedure for unnecessary pattern deleting processing.

Finally, the fundamental function of the unnecessary pattern deleting section 203-6 will be described. Since the kinds of the neighboring master cells to be arranged are not known, the neighborhood, or region of the master cell frame is designed to have a sufficient margin. Thus, as shown in FIG. 18, after modifying the master cell, the unnecessary patterns occurring in the neighborhood of the master cell are deleted according to the following procedure (FIG. 19), so that the distance between neighboring master cells can be decreased.

Figure 20:
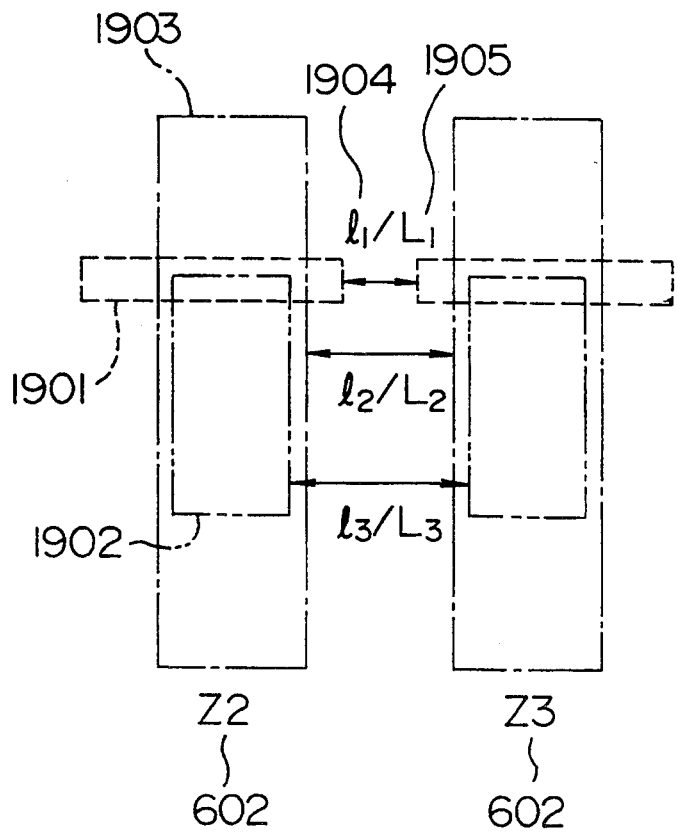
FIG. 20 is a diagram showing an example of the protection area for each mask layer.
Figure 21:
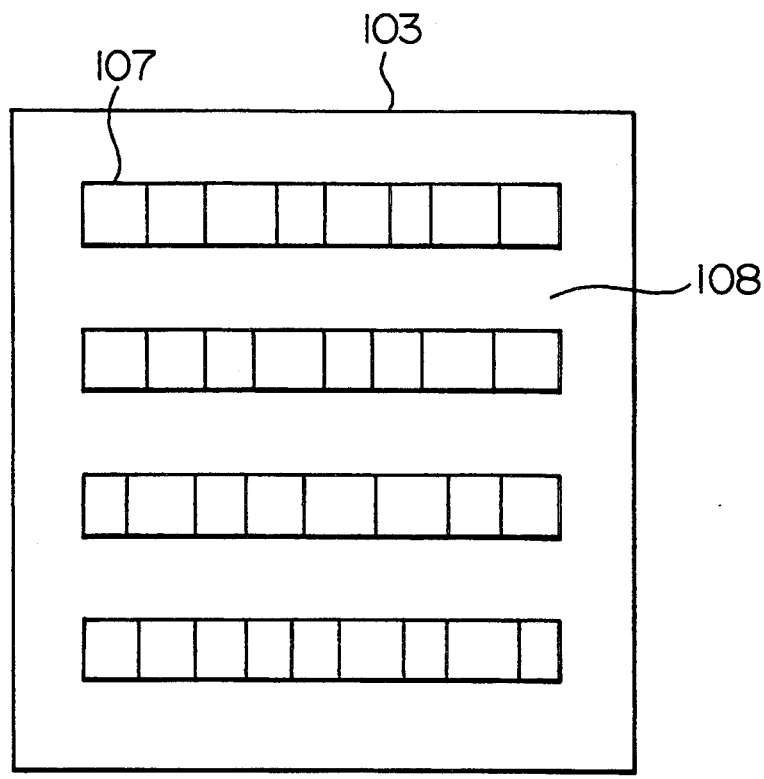
FIG. 21 is a diagram showing the building block system of the conventional LSI layout design system.

In a step S21, as shown in FIG. 20, there are generated information of rectangular protection regions having minimum-areas which completely include all the pattern of each mask layer in the master cell Z2, Z3. However, for the aluminum-1 layer to which the power, earth and signal wiring line patterns belong, the protection region is exceptionally limited to the signal wiring line patterns. In addition, one protection region is generated for each pattern (the added pattern in modifying is regarded as part of bus wiring). Moreover, the protection regions in contact with each other are neglected. As illustrated in FIG. 20, there are generated an aluminum-1 layer protection region (the rectangle ABCD in FIG. 18) (six other regions are generated, but the regions are neglected because they are in contact with each other on the boundary of the master cells), a contact layer protection region (the rectangle EFGH in FIG. 18) and an aluminum-2 layer protection region 1903 (the rectangle IJKL in FIG. 18).

In a step S22, the current distance li (1904) and the distance Li (1905) according to the design rule are found for each protection region.

In a step S23, the possible distance D between two master cells is determined from the following equation.

$$D = \mathop{\mathrm{MAX}}_{i}(li - Li)$$

In a step S24, the origin 18 of the right master cell is moved right by D.

A pattern of signal wiring line finally not used may remain. This can be decided from the blanks continuously appearing in the row direction on the table in FIG. 15. Since this pattern causes unnecessary capacitances, the data may be deleted.

The layout pattern thus generated is displayed on the graphic display 201 as the layout pattern.

Thus, the high-density layout design can be made in a shorter time according to the present invention using the DA technique as described above.

The semiconductor integrated circuit designed according to the layout design method of the present invention has circuit sections (for example, macro cells) connected in at least two directions, each circuit section including master cells vertically and horizontally placed without gap and connected through signal wiring line patterns, and each master cell being designed common to a logic function for the layout of an element. The signal wiring line patterns interconnecting the master cells also connect the logic blocks of the NAND, NOR, Flip-flop and so on laid out within each of the master cells. The signal wiring line patterns between the logic blocks are composed of first wiring layer patterns provided in a predetermined direction and second wiring layer patterns connected to the first wiring layer patterns with contacts and directly connected to the elements of the logic blocks. In addition, as will be understood from the layout of the master cells shown in FIG. 18, the power supply line or earth line, after wiring the master cells, is formed between signal wiring line patterns of a certain wiring layer connecting the logic blocks by using the same wiring line layer.

Since this semiconductor integrated circuit is designed according to the layout design method mentioned above, fewer types of general-purpose master cells are required in the arrangement so that the input/output positions of the master cells can be freely decided according to the relation of the surrounding master cells. Therefore, the time required to design the semiconductor integrated circuit is short. Also, this layout method has the high design efficiency and the higher integration density, compared to an LSI designed by the conventional building block system or other methods. The distance between all the logic blocks within the circuit section such as the macro cell is smaller than the width of the logic blocks themselves.

This semiconductor integrated circuit is compact and of high performance and takes a short time to design.

While only the layout design of the semiconductor integrated circuit has been described above, this invention can be widely applied to all graphic pattern layout design using the existing design means (for example, part of a printed wiring board having a particular function is previously provided).

According to the layout design method of this invention, the high-density and high-performance semiconductor integrated circuit can be designed in a short period.

What is claimed is:

1. An LSI layout design method comprising the steps of:

providing in advance a plurality of master cells, each master cell including at least one element and a plurality of signal wiring lines which are not connected to any of the elements within the master cell;

arranging said plurality of master cells on a diagram, corresponding to a plan view area of a main surface of a chip;

mutually connecting specified ones of said plurality of signal wiring lines between different ones of the arranged said plurality of master cells in accordance with information of logic circuits to be effected of said LSI; and connecting, within specified ones of the arranged said plurality of master cells, ones of said plurality of signal wiring lines to respective elements.

2. An LSI layout design method comprising the steps of:

providing in advance a plurality of master cells, each of which including at least one element and a plurality of signal wiring lines which are not connected to any of the elements within the master cell and each of which having candidates of signal input/output positions;

arranging said plurality of master cells on a diagram, corresponding to a plan view area of a main surface of a chip; and mutually connecting specified ones of said plurality of signal wiring lines between different ones of the arranged said plurality of master cells in accordance with information of logic circuits to be effected of said LSI.

3. A layout design method according to claim 2, further comprising the step of determining at least one of said candidates of said signal input/output positions of each said master cell, after said plurality of master cells are arranged.

4. An LSI layout design method comprising the steps of:

providing in advance a plurality of master cells, each of which including at least one element and a plurality of signal wiring lines which are not connected to any of the elements within the master cell;

arranging said plurality of master cells on a diagram, corresponding to a plan view area of a main surface of a chip; and determining two or more from among connection points between neighboring ones of said plurality of master cells, after said plurality of master cells are densely arranged; and specifying ones of said plurality of signal wiring lines, in each of neighboring master cells, which are to be mutually connected, via the determined connection points, after said plurality of master cells are densely arranged.

5. An LSI layout design method comprising the steps of:

providing in advance a plurality of master cells, each of which including at least one element and a plurality of signal lines which are not connected to any of the elements within the master cell;

densely arranging said plurality of master cells on a diagram, corresponding to a plan view area of a chip, substantially without leaving any gap between adjacently disposed master cells in at least two directions; and mutually connecting specified ones of said plurality of signal wiring lines between different ones of said plurality of master cells in accordance with information of logic circuits to be effected of said LSI, after said plurality of master cells are densely arranged.

6. A layout design method according to claim 5, wherein said densely arranging step includes the step of removing unnecessary portions in accordance with a design rule to couple the master cells to one another.

7. An LSI layout design method comprising the steps of:

providing in advance a plurality of master cells, each master cell including at least one element and a plurality of patterns of signal wiring conductors which are not connected to any of the elements within the master cell;

arranging said plurality of master cells on a diagram, corresponding to a plan view area of a main surface of a chip; and adding contact patterns or wiring line patterns to a layout pattern of each of the arranged master cells to effect connections between elements and specified ones of said patterns of signal wiring conductors within respective master cells and effect connections between specified ones of said patterns of signal wiring conductors in different ones of the arranged master cells in accordance with information of logic circuits to be effected of said LSI.

8. A layout design method according to claim 7, wherein said adding step includes the step of adding to the arranged master cells wiring line patterns which are long enough to reach a frame of each of the arranged master cells.

9. A layout design method according to claim 7, further comprising the step of removing patterns which are not necessary for realizing a desired logic circuit from each of the arranged master cells.

10. An LSI layout design method comprising the steps of:

providing in advance layout patterns of a plurality of master cells, each master cell including at least one element and patterns of signal wiring conductors which are not connected to any of the elements within the master cell;

assigning each master cell to portions of a logic diagram of a circuit for realizing a desired logic circuit arrangement;

arranging the layout patterns of the assigned master cells on a diagram, corresponding to a plan view area of a main surface of a chip, in accordance with information of positions of the master cells assigned on said logic diagram; and adding patterns of conductors for effecting connections between specified ones of said patterns of signal wiring conductors in different master cells and between elements and specified ones of said patterns of signal wiring conductors within respective master cells, after said plurality of master cells are arranged.

11. A layout design method for an LSI on a chip, comprising the steps of:

providing in advance a plurality of master cells for different functions, each master cell having a pattern of an element and patterns of signal wiring conductors not connected to the element;

assigning said plurality of master cells to portions of a logic diagram of a circuit for realizing a desired logic circuit arrangement, in accordance with a logical function of each master cell, and to densely arrange the assigned master cells on the logic diagram, corresponding to a plan view area of a main surface of said chip, by vertically and horizontally modifying a position of each assigned master cell; and adding contact or wiring line patterns to a layout pattern of each of the arranged master cells to effect connections between the pattern of said element and at least one of the patterns of said signal wiring conductors and between patterns of said signal wiring conductors of said arranged master cells.

12. A layout design method according to claim 1, wherein the step of arranging said plurality of master cells includes arranging said plurality of master cells in accordance with an X-and Y-coordinates system.

13. A layout design method according to claim 12, further comprising the steps of:

assigning to a predetermined signal at least one of said plurality of signal wiring lines of different master cells having the same X-coordinate or Y-coordinate, after said plurality of master cells are arranged; and connecting the assigned signal wiring line to one or more elements.

14. A layout design method according to claim 6, wherein said at least two directions include vertical and horizontal directions with respect to an X-and Y-coordinates system.

15. A layout design method according to claim 5, wherein said at least two directions include vertical and horizontal directions with respect to an X-and Y-coordinates system.

16. A layout design method according to claim 11, wherein the step of assigning includes arranging the assigned master cells by vertically and horizontally modifying a position, using an X-and Y-coordinates system, of each one thereof to substantially eliminate any gaps between adjacently disposed master cells.

17. A layout design method according to claim 16, wherein each one of said plurality of master cells has the same number of patterns of signal wiring conductors.

18. A layout design method according to claim 11, wherein each one of said plurality of master cells has the same number of patterns of signal wiring conductors.

19. A layout design method according to claim 12, wherein each one of said plurality of master cells includes the same number of wiring lines.

20. A layout design method according to claim 1, wherein each one of said plurality of master cells includes the same number of wiring lines.

* * * * *